(12) United States Patent
Hsu

(10) Patent No.: US 6,174,804 B1
(45) Date of Patent: Jan. 16, 2001

(54) DUAL DAMASCENE MANUFACTURING PROCESS

(75) Inventor: Chen-Chung Hsu, Taichung (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/159,912

(22) Filed: Sep. 24, 1998

(30) Foreign Application Priority Data

May 26, 1998 (TW) ................................................ 87108191

(51) Int. Cl.[7] .................................................. H01L 21/4763
(52) U.S. Cl. ...................... 438/638; 438/620; 438/622; 438/627; 438/628; 438/629; 438/633; 438/637; 438/643; 438/644; 438/645; 438/648; 438/653; 438/654; 438/656; 438/666; 438/672; 438/675; 438/685; 438/677; 438/688
(58) Field of Search ..................... 438/620, 622, 438/627, 628, 629, 633, 637, 638, 643, 644, 645, 648, 653, 654, 656, 666, 672, 675, 685, 687, 688

(56) References Cited

U.S. PATENT DOCUMENTS

| 5,382,545 | * | 1/1995 | Hong ..................................... 437/195 |
| 5,518,963 | * | 5/1996 | Park ..................................... 437/195 |
| 5,700,737 | * | 12/1997 | Yu et al. .............................. 438/636 |
| 5,721,155 | * | 2/1998 | Lee ....................................... 437/195 |
| 5,801,099 | * | 9/1998 | Kim et al. ............................ 438/666 |
| 5,821,164 | * | 10/1998 | Kim et al. ............................ 438/633 |
| 6,033,977 | * | 3/2000 | Gutsche et al. ...................... 438/618 |

* cited by examiner

Primary Examiner—John F. Niebling
Assistant Examiner—David A. Zarneke (57) ABSTRACT

A dual damascene process for forming interconnects such as contact plugs or vias. A first metal line is formed on a substrate structure. A first metal line is formed on the substrate structure. At least a stud is formed to cover a part of the first metal line. An insulation layer is formed to cover the substrate structure, the first metal line and the stud. A part of the insulation layer is removed to expose the stud. The expose stud is removed to form a contact window to expose the part of the first metal line. A metal layer is formed to fill the contact window.

33 Claims, 8 Drawing Sheets

DUAL DAMASCENE MANUFACTURING PROCESS

CROSS-REFERENCE TO RELATED APPLICATION

This application claims the priority benefit of Taiwan application Ser. No. 87108191, filed May 26, 1998, the full disclosure of which is incorporated herein by reference.

BACKGROUND OF THE INVENTION

1. Field of Invention

The present invention relates to a method of manufacturing multi-level interconnects in semiconductor manufacture. More particularly, the present invention relates to a method of manufacturing multi-level interconnects using a dual damascene process.

2. Description of Related Art

A typical integrated circuit comprises various devices and components. These devices or components are typically insulated by an isolation structure. To electrically connect certain parts of the devices or component, an interconnect is commonly used. In the conventional method of manufacturing interconnects, a metallic layer is deposited over a substrate. A portion of the metallic layer is etched away to form a desired metallic wiring pattern. The metallic wiring pattern is then covered by an insulation layer to is to avoid any unwanted connection to other conductive part of layer. A vertical via hole is formed through the insulation layer to electrically connect the metallic wiring layer. In general, an inter-metal dielectric (IMD) layer is used as an insulation layer to isolate the metallic layer other metallic layer or metallic wiring. The connection between the metallic layer and other metallic layer or metallic wiring is achieved through a vertical via.

At present, two methods of fabricating interconnects such as plugs or vias are used in the semiconductor industry. The first method uses two separate stages for forming the interconnects. A dielectric layer is formed over a first metallic layer, and then a photoresist layer is deposited over the dielectric layer. Etching techniques are used to form a via hole, and then a conductive material is deposited into the via holes to form a via for electrical connection. A second metallic layer is deposited over the dielectric layer followed by the patterning of the second metallic layer.

This second method is a dual damascene process. In the conventional dual damascene process, an insulation layer is first formed over a substrate structure, and then the insulation layer is planarized. According to the required metallic wiring pattern and positions of vias, the insulating layer is etched to form horizontal trenches and vertical via holes. In other words, the lower portion of the insulating layer is etched to expose some of the device regions or portions of the metallic lines below, thereby to form a vertical via hole. The upper portion of the insulating layer is also etched to form a horizontal trench. A metallic material is then deposited over the substrate structure to fill the horizontal trench and the via hole at the same. Chemical-mechanical polishing (CMP) method is used to planarize the surfaces of the devices, and then another dual damascene process can be carried out again. Since two metal-filling operations for forming the respective horizontal trenches and vertical via holes are combined into a single operation, the operation is referred to as a dual damascene process.

FIGS. 1A through 1I are cross-sectional views showing the progression of manufacturing steps in producing interconnects using a conventional dual damascene process.

Figure 1A:
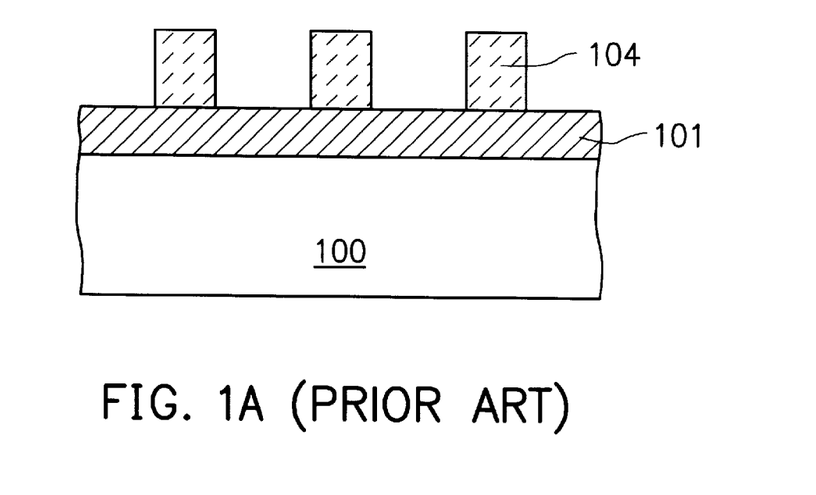
FIGS. 1A through 1I are cross-sectional views showing the progression of manufacturing steps in producing vias and interconnects using a conventional dual damascene process.

As shown in FIG. 1A, a substrate structure 100 having a planar surface is provided. For clarity, devices within the substrate structure 100 are not sketched. A metallic layer 101 is formed over the substrate structure 100. A patterned photoresist layer 104 is formed over the metallic layer 101. The patterned photoresist layer 104 covers regions above the metallic layer 101 where metallic lines are desired.

Figure 1B:
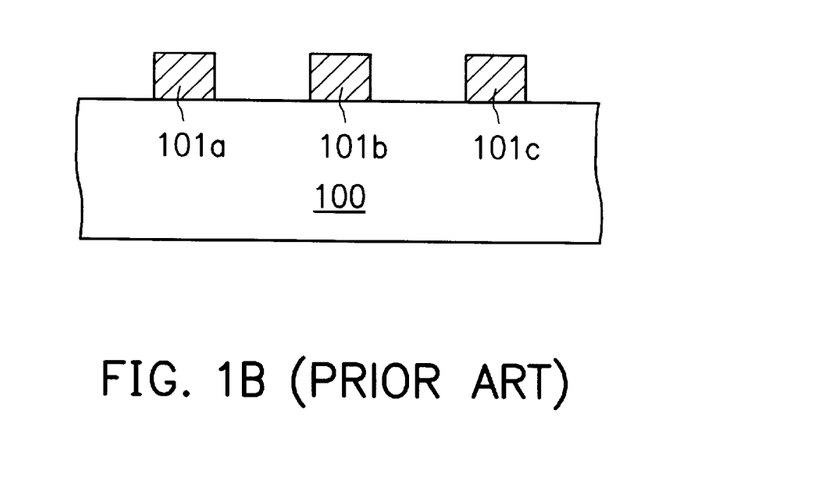

As shown in FIG. 1B, using the photoresist layer 104 as a mask, the metallic layer 101 is etched. For example, a reactive ion etching (RIE) method is used to etch away a portion of the metallic layer 101 forming metallic lines 101a, 101b and 101c and exposing the substrate structure 100 below. Subsequently, the photoresist layer 104 is removed.

Figure 1C:
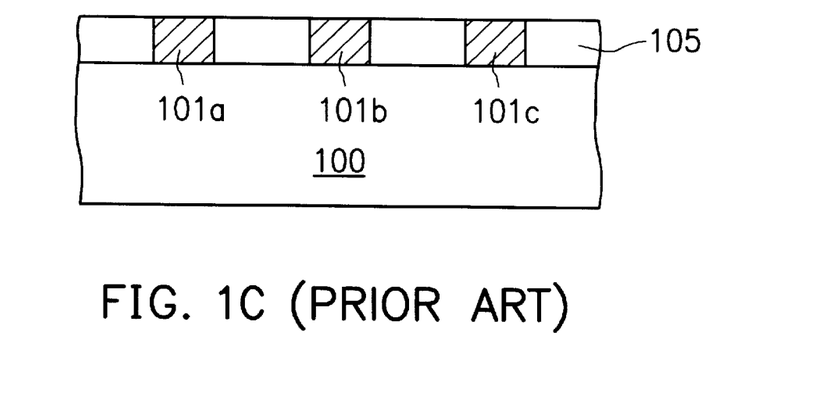

In FIG. 1C, an insulation layer 105, for example, a silicon oxide layer is deposited over the substrate structure 100. Excess insulation layer 105 above the metal lines 101a, 101b and 101c are removed using, for example, a chemical-mechanical polishing (CMP). Hence, the top surface of the metal lines 101a, 101b and 101c are exposed.

Figure 1D:
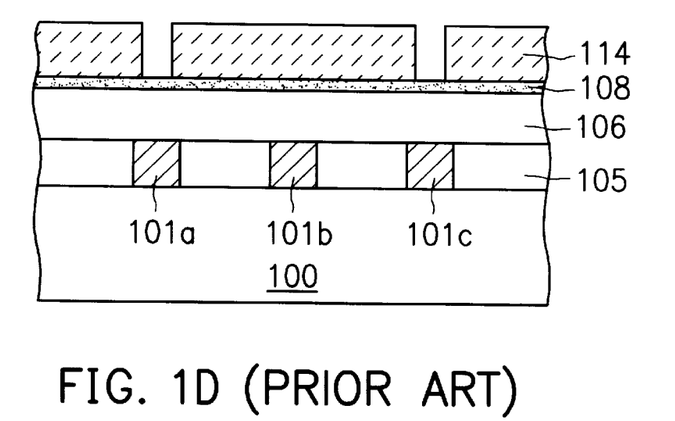

In FIG. 1D, another insulation layer 106, for example, a silicon oxide layer are deposited over the substrate structure 100 and covering the metal lines 101a, 101b and 101c and the insulation layer 105. The insulation layer 106 has a thickness roughly equals to the vertical height of subsequently formed metal plugs. After that, the insulation layer 106 is planarized, and then an etching stop layer 108, for example, a silicon nitride layer is deposited over the insulation layer 106. Subsequently, another patterned photoresist layer 114 is formed over the etching stop layer 108. The patterned photoresist layer 114 exposes regions on the etching stop layer where vias for extending to the respective metal lines 101a and 101c are desired.

Figure 1E:
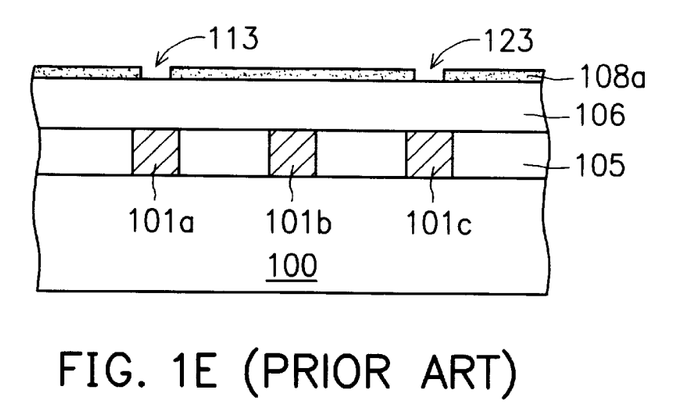

In FIG. 1E, using the photoresist layer 114 as a mask, the silicon nitride layer 108 is etched. For example, using a reactive ion etching (RIE) method, openings 113 and 123 are formed in the etching stop layer 108a. The openings 113 and 123 exposes a portion of the insulation layer 106 in regions that correspond to the locations where vias leading to the metal lines 101a and 101c are desired. Subsequently, the photoresist layer 114 is removed.

Figure 1F:
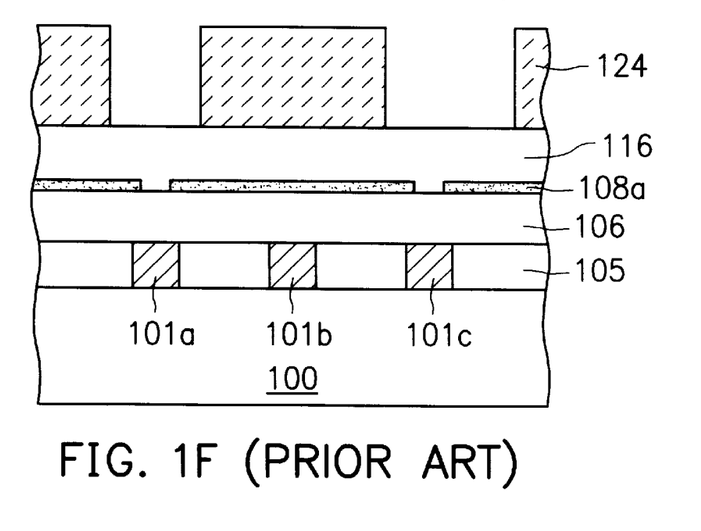

In FIG. 1F, a third insulation layer 116, for example, a silicon oxide layer is deposited over the etching stop layer 108a. The third insulation layer 116 has a thickness roughly equal to the thickness of the horizontal trenches after the dual damascene structure is formed. Thereafter, a third patterned photoresist layer 124 is formed over the insulation layer 116. The third patterned photoresist layer 124 exposes a portion of the insulation layer 116 in regions that correspond to the locations where the final horizontal trenches that have connections with the metal lines 101a and 101c are desired.

Figure 1G:
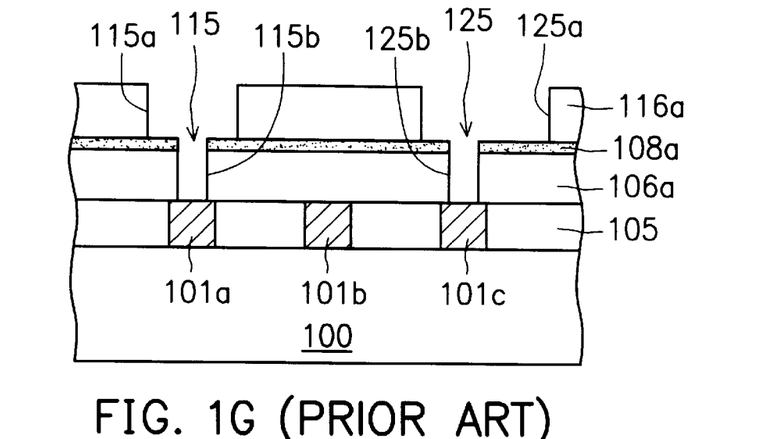

In FIG. 1G, using the third photoresist layer 124 as a mask, the third insulation layer 116 is etched. For example, a reactive ion etching (RIE) is used to etch out horizontal trenches 115a and 125a in the insulation layer 116 where metal lines will be formed. A portion of the horizontal trenches 115a and 125a are aligned over the subsequently formed via holes 115b and 125b respectively. Thereafter, the insulation layer 106a is etched to form via holes 115b and 125b that exposes the respective metal lines 101a and 101c. Due to the presence of the etching stop layer 108a, a top-wide/bottom-narrow type of openings such as 115 and 125 can be formed by using an etchant having a high etching selectivity for silicon oxide in the etching operation. Subsequently, the photoresist layer 124 is removed.

Figure 1H:
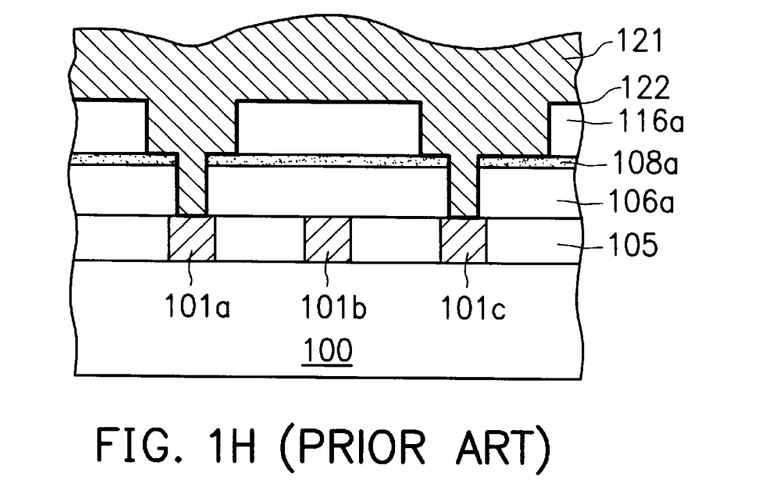

In FIG. 1H, a conformal glue/barrier layer 122 is deposited over the horizontal trenches 115a and 125a as well as the vertical via holes 115b and 125b. The conformal glue/barrier layer 122 serves to increase adhesion of subsequently deposited metal or other materials. Thereafter, a metallic layer 121 is deposited over the insulation layer 116a and filling the horizontal trenches 115a and 125a as well as the vertical via holes 115b and 125b.

Figure 1I:
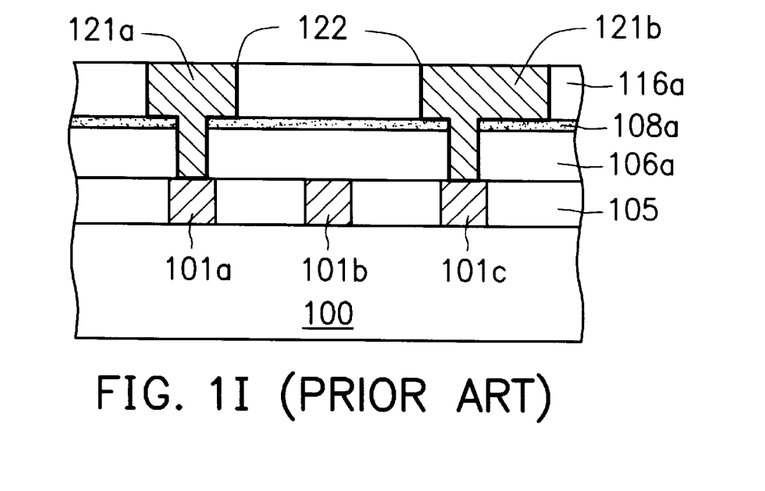

In FIG. 1I, a chemical-mechanical polishing method is used to remove redundant portions of the metallic layer 121 above the insulation layer 116a exposing the insulation layer 116a. Hence, dual damascene structures 121a and 121b are formed.

In the above dual damascene process of forming metal interconnects such as contact vias or plugs, complicated steps are needed to form the tapering vias. In fact, major defects of the above method includes:

1. At least two insulation layers (that is, inter-metal dielectric layer) are reguired.
2. At least an additional etch stop layer is required, and consequently, at least a photolithography and etching process is required for forming the etch stop layer.
3. The vias are not formed self-aligned. A misalignment is easily to occur during photolithography and etching process.

SUMMARY OF THE INVENTION

Accordingly, the present invention is to provide an improved dual damascene process for forming interconnects and vias. The dual damascene process not only is capable of preventing the defects produced by a conventional dual damascene process, but is also capable of simplifying operational procedure.

To achieve these and other advantages and in accordance with the purpose of the invention, a process of dual damascene process is provided. A metallic layer and a first insulation layer are formed over a substrate structure in sequence. The first insulation layer and the metallic layer are patterned, so that a metallic line with a conformal insulation layer thereon is formed. The first insulation layer on the metal line is patterned, so that a part of the metallic line is covered by the first insulation layer, and the other part of the metal line is exposed. The part of the metallic line covered by the first insulation layer is called the first metal line, and the exposed part of the metallic line is the second metal line. A second insulation layer is formed over the substrate structure. The second insulation layer is patterned to form a horizontal trench that exposes the first insulation layer on the second metal line. The first insulation layer is then removed to form a vertical via which exposes the second metal line. A second metallic layer is formed over the second insulation layer to fill the trenches and the vertical vias and thus, to electrically connect the second metal line. The second metallic layer is then planarized until the insulation layer is exposed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
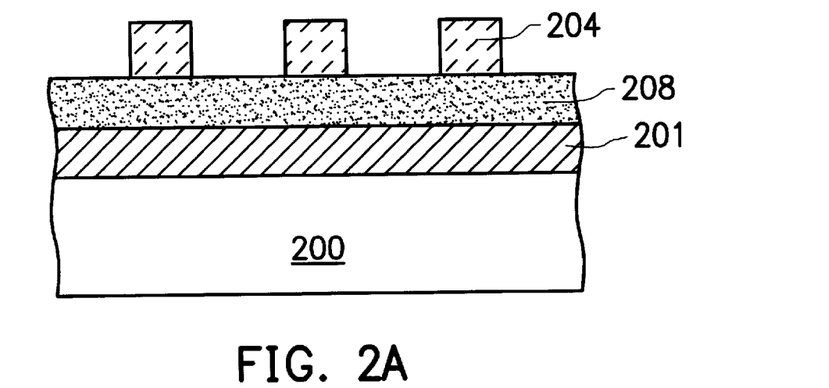
FIGS. 2A through 2K are cross-sectional views showing the progression of manufacturing steps in producing vias and interconnects using a dual damascene process according to one preferred embodiment of this invention.

FIGS. 2A through 2K are cross-sectional views showing the progression of manufacturing steps in producing vias and interconnects using a dual damascene process according to one preferred embodiment of this invention As shown in FIG. 2A, a substrate structure 200 is provided. Preferably, the substrate structure 200 is planarized to advantage the subsequent process. A conductive layer 201 is formed over the substrate structure 200. The conductive layer 201 is typically copper, aluminum, or aluminum-copper alloy, though other conductive materials may also be used. Thereafter, an insulation layer 208 is formed over the metallic layer 201 using, for example, a chemical vapor deposition method or other deposition methods. A patterned photoresist layer 204 is formed on regions of the insulation layer 208. The regions covered by the photo-resist layer 204 are the regions for forming metal lines.

Figure 2B:
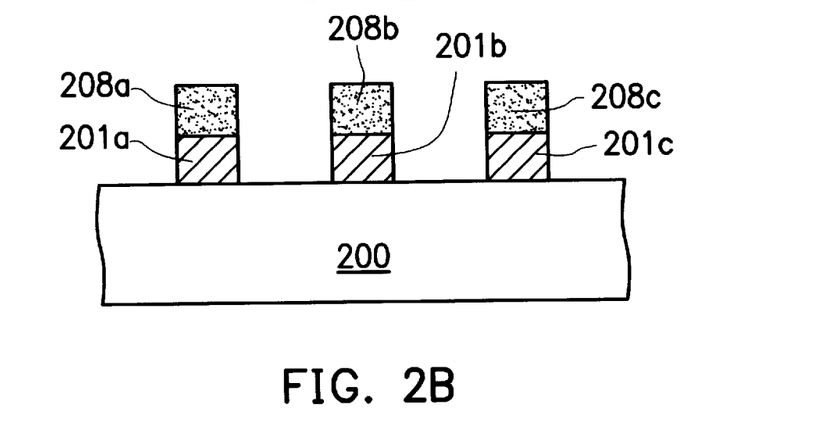
Figure 2C:
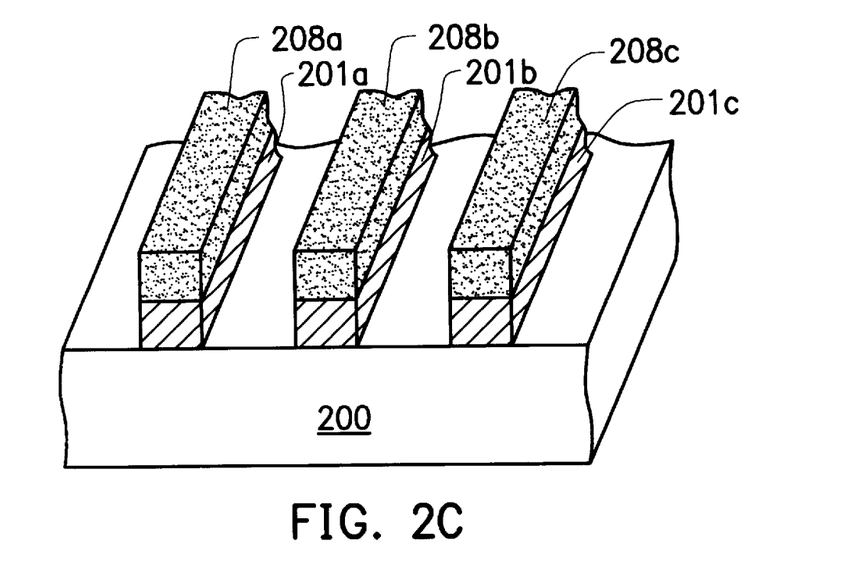

As shown in FIG. 2B, using the photoresist layer 204 as a mask, the exposed regions of the insulation layer 208 and the metallic layer 201 under the exposed regions are etched to form metal lines 210a, 201b and 201c. At the same time, patterned insulation layers 208a, 208b and 208c conformal to the metal lines 210a, 210b, and 210c are formed on the metal lines 201a, 201b and 201c, respectively. A top view of the patterned insulation layers 208a, 208b, and 208c are shown as FIG. 2C. The insulation layer 208 may be defined into different patterns according to the specific requirements or the configuration of the metal lines. A column shape is used as an example for the metal lines 201a, 201a, and 201cin this embodiment.

Figure 2D:
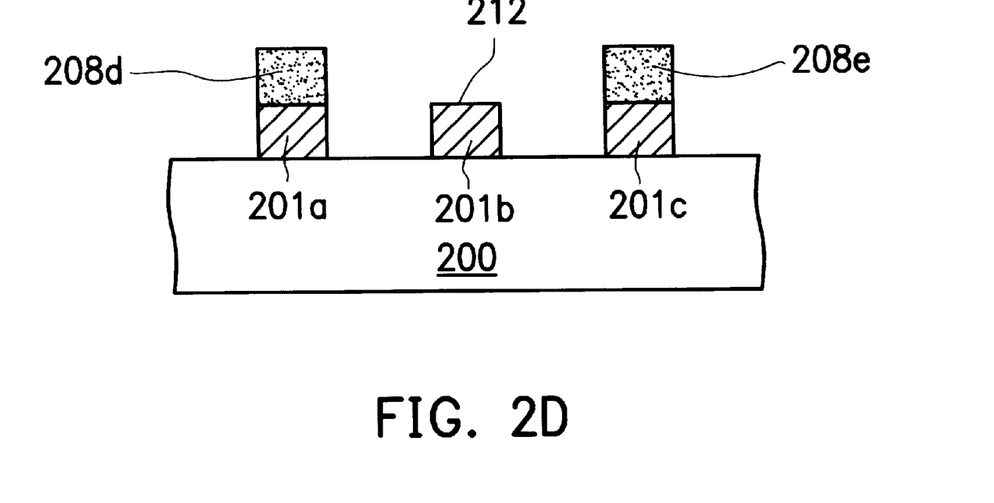
Figure 2E:
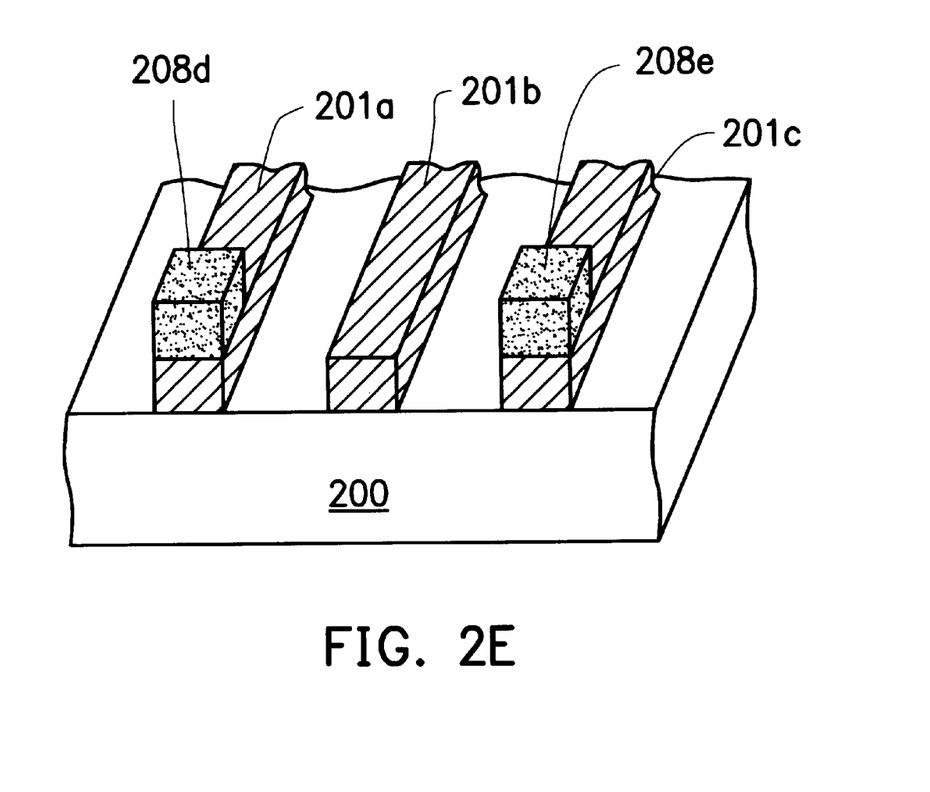

As shown in FIG. 2D, vertical vias are defined by using dual damascene process. That is, a patterned photoresist layer (not shown in the figure) is formed to cover predetermined regions of the insulation layers 208a, 208b and 208c above the metal lines 201a, 201b and 201c. In this example, the insulation layers 208b is completely covered by the patterned photoresist layer. However, only a part of each of the insulation layers 208a and 208c are covered by the photoresist layer. The insulation layers 208a, 208b and 208c are then etched by, preferably, a reactive ion etching (RIE) method, though other etching processes may be used. The upper surfaces of the metal lines 201a, 201b and 201c are used as etch stop in the etching operation. Consequently, a pattern of pillars of insulation layers 208d and 208e are formed. A part of the top surface of the metal lines 201a and 201c and the whole top surface 212 of the metal line 201b are exposed. The pillars of insulation layers 208d and 208e act as studs in the subsequent fabrication process for forming vertical vias. Moreover, the pillars of insulation layers 208d and 208e can be completely conformal or only partially conformal to the metal lines 201a and 201c, depending on the design and specific requirements for forming vertical vias. Subsequently, when the horizontal trenches of the dual damascene structure are formed, the stud-like insulation layers 208d and 208e can be removed to obtain vias that self-align with the respective metal lines. The top view of the stud-like insulation layers 208d and 208e is shown as FIG. 2E.

Figure 2F:
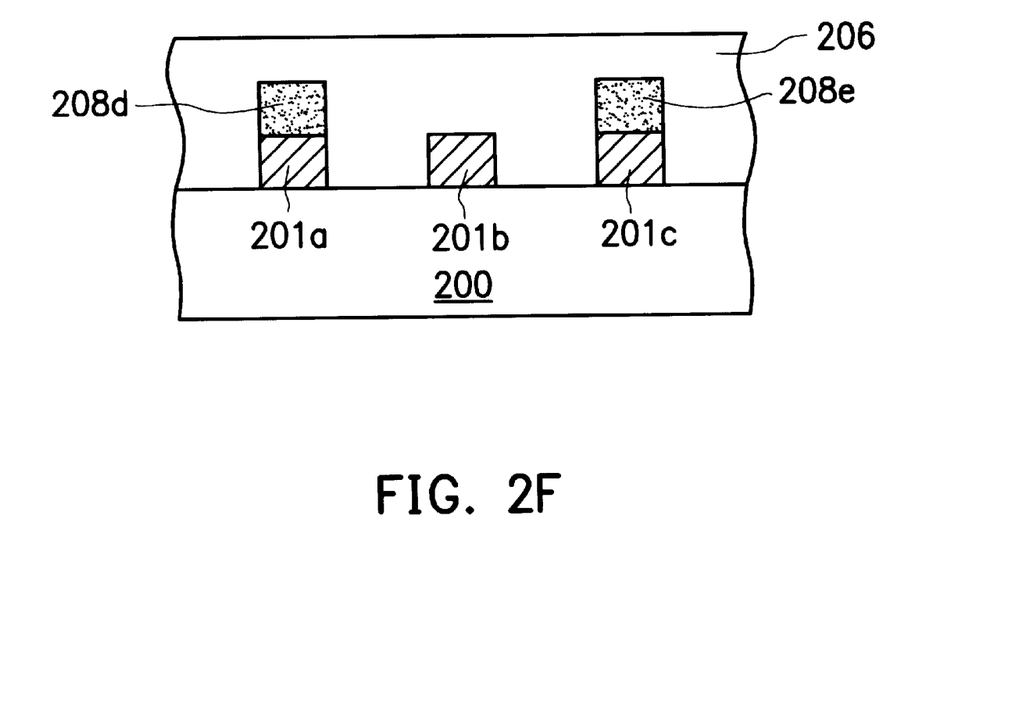

As shown in FIG. 2F, an insulation layer 206, for example, a silicon oxide layer deposited by a chemical vapor deposition method is formed over the substrate structure 200. The insulation layer 206 covers the columnar insulation layers 208d and 208e as well as the metal lines 201a, 201b and 201c. The insulation layer 206 is planarized, preferably, by chemical-mechanical polishing (CMP), though other planarization technique may be applied. Advantageously, after being planarized, the insulation layer 206 remained on the pillars of insulation layers 208d and 208e has approximately a same thickness of a horizontal trenches formed by a subsequently dual damascene process. That is, the thickness between the top surface of the insulation layer 206 and a level of the top surfaces 218d and 218e is approximately the same as the depth of the horizontal trenches formed by a subsequently dual damascene process.

Figure 2G:
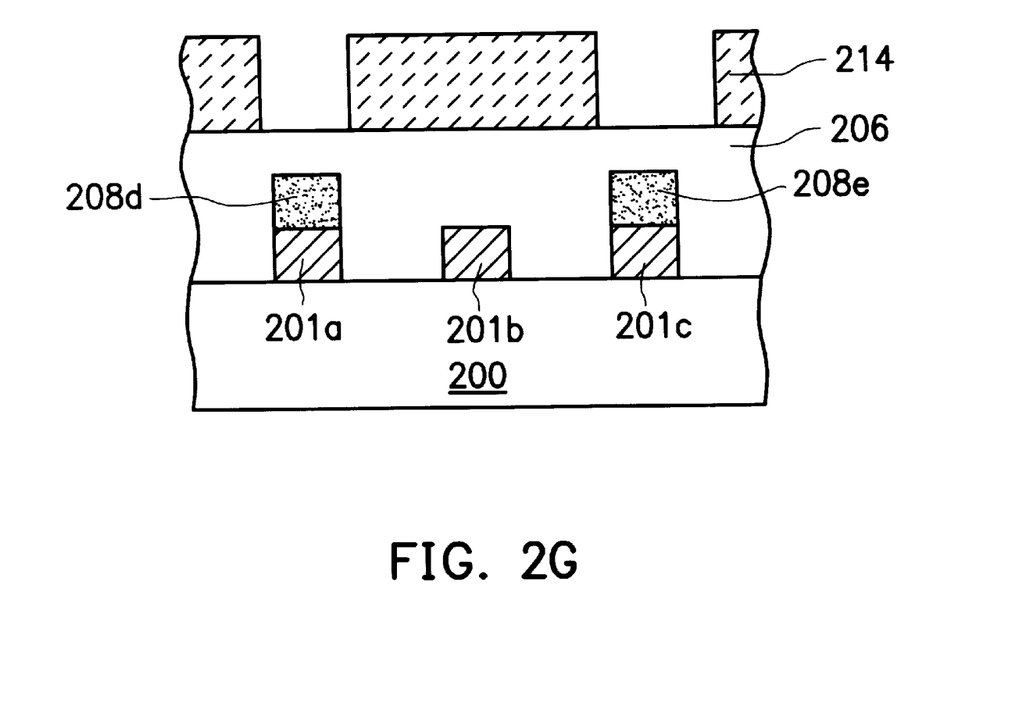

In FIG. 2G, a patterned photoresist layer 214 is formed over the insulation layer 206 with openings aligned over the pillars of the insulation layers 208d and 208e. Regions of the insulation layer 206 determined for forming metal lines subsequently are exposed within the openings. That is, in this example, the insulation layer 206 covering the pillars 208d and 208e is exposed.

Figure 2H:
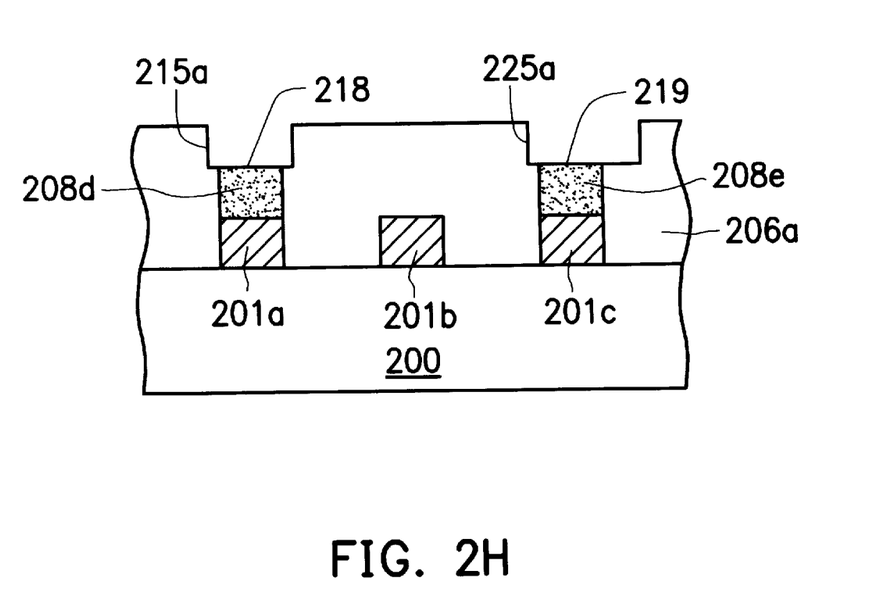

In FIG. 2H, using the photoresist layer 214 as a mask, the exposed insulation layer 206 is etched using, for example, a reactive ion etching (RIE) method with the pillars of insulation layers 208d and 208e as an etch stop. As a consequence, horizontal trenches 215a and 225a are formed in the insulation layer 206a to expose the upper surfaces 218 and 219 of the pillars of insulation layers 208d and 208e. Since the positions for forming the vertical vias are pre-arranged at the locations occupied by the pillars of insulation layers 208d and 208e, self-aligned vias are easy to obtain. The self-aligned vias can be formed easily by using an etchant having a higher etching selectivity for material of the pillars of insulation layers 208d and 208e to than insulation layer 206a.

Figure 2I:
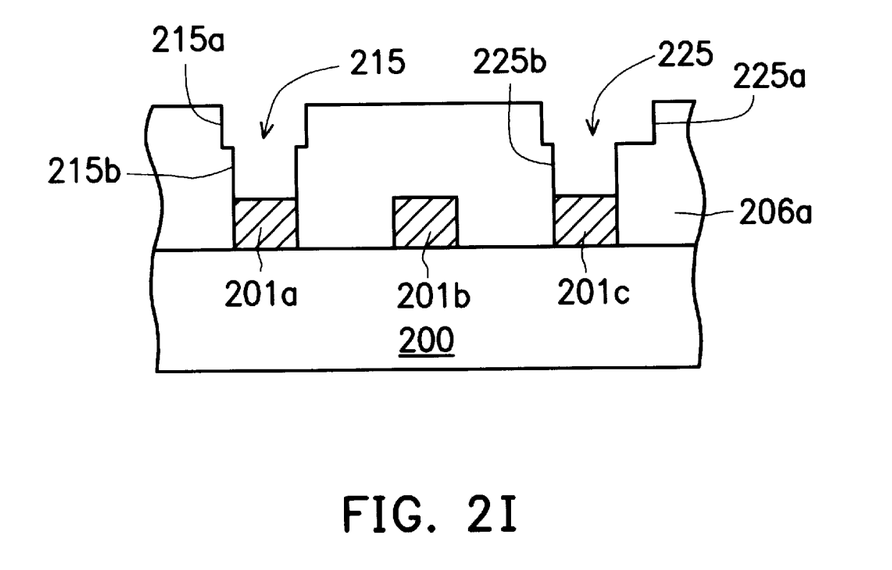

In FIG. 2I, the pillars of insulation layers 208d and 208e are etched to form self-aligned vias 215b and 225b in the insulation layer 206a. As mentioned above, the pillars of the insulation layers 208d and 208e are removed by etching with a higher selectivity than the insulation layer 206a, so that substantially, the pillars of the insulation layers 208d and 208e are removed without removing the insulation layer 206a. Also, the thickness between top surface of the insulation layer 206a and the bottom level of the openings 215a and 215b are approximately the same. Even if a portion of the insulation layer 206a is removed while etching the pillars 208d and 208e, with a much lower selectivity, the thickness of the removed portion of the insulation layer 206a is much less than the depth of the horizontal trenches 215a and 225a. The dual damascene structure, that is, the topography of the horizontal trenches 215a, 225a and the openings 215b, 225b is still well defined.

Preferably, the studs 208d and 208e are removed by immersing the wafer in an etchant having a high etching selectivity for the material of the studs to the insulation layer 206a, though the studs 208d and 208e can also be removed by other etching processes. After the etching operation, the openings 215b and 225b are aligned precisely over the metal lines 201a and 201c. The horizontal trenches 215a and 225b are combined with the openings 215b and 215b as contact windows 215 and 225, respectively. Hence, the dual damascene process of this invention is capable of producing vias or contact windows self-aligned over the metal lines.

Figure 2J:
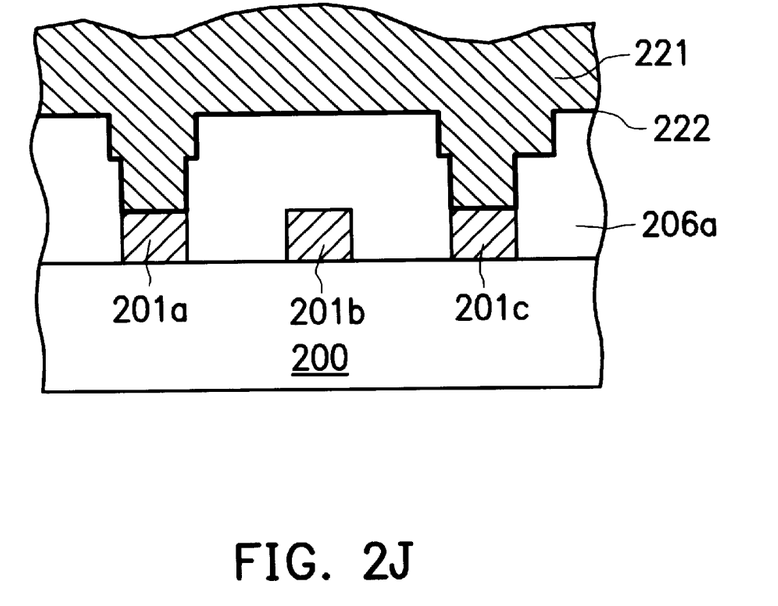

In FIG. 2J, a conformal glue/barrier layer 222 is deposited on the surface of the contact windows 215 and 225. The glue/barrier layer 222 can be selected from a composite conductive layer, for example, a titanium/titanium nitride (Ti/TiN) layer or a tantalum/tantalum nitride (Ta/TaN) layer, though other material may also be used. The glue/barrier layer 222 mainly serves to increase adhesion between subsequently deposited metallic material and the metal lines 201a, 201b, and 201c, or avoid mutual diffusion between the metal lines 201a, 201b, 201c and the subsequently deposited metallic material.

A metallic layer 221 selected from at least one of the materials such as, for example, copper, aluminum, or aluminum-copper alloy or other conductive materials is deposited to cover the insulation layer 206a and fill the windows 215 and 225. Hence, electrical connection for the metal lines 201a and 201c is established.

Figure 2K:
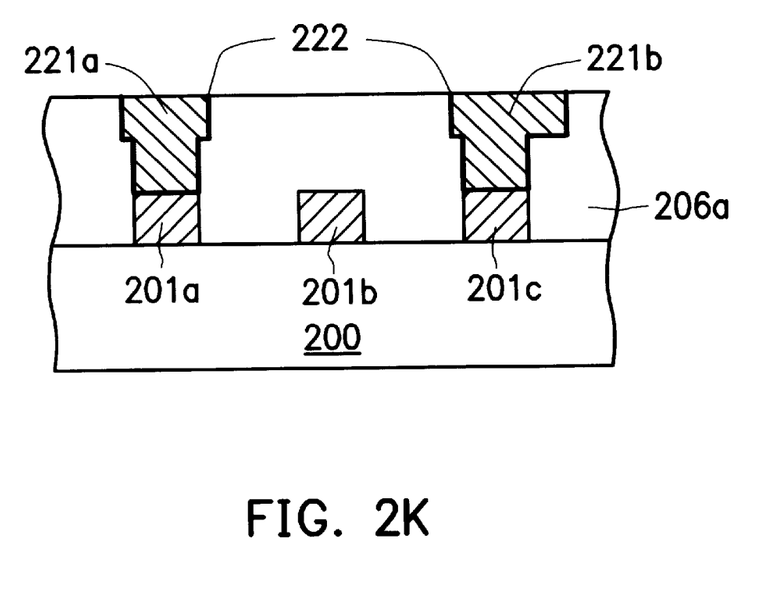

In FIG. 2K, a planarization process, for example, a chemical-mechanical polishing (CMP) opera, is performed to planarize and to remove the excessive metallic layer 221 above the insulation layer 206a. The upper surface of the insulation layer 206a is exposed and dual damascene structures, vertical vias, 221a and 221b are formed.

In the invention, the predetermined positions for forming vertical vias above the metal lines are occupied by pillars of insulation layers (studs). The horizontal trenches are formed to expose the pillars. The vertical vias are formed precisely aligned with the metal lines without additional operations. Therefore, the vias are consider self-aligned.

In a conventional dual damascene process, generally, deposition of two or more etching stop layers and two insulation layers are required. Furthermore more than one photolithograph and etching process is required. The multiple photolithograph and etching process cause a great possibility of misalignment, especially for process of submicron line width. The dual damascene process of this invention reduces the steps of the manufacturing process, especially, the photolithography and etching process, and hence, capable of increasing precision of process and reducing processing time and production cost.

The processing steps and equipment used in this invention are compatible with most manufacturing facilities, and hence can be easily arranged for production.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene process, comprising:

providing a substrate structure;

forming a first metallic layer and a first insulation layer on the substrate structure in sequence;

patterning the first insulation layer and the first metallic layer, so that a metallic line covered by a conformal first insulation layer is formed;

removing a part of the conformal first insulation layer to form a first metal line and a second metal line of the first metallic line, the first metal line being exposed by removing the part of the conformal first insulation layer and the second metal line being covered by the remaining first insulation layer;

forming a second insulation layer to cover the substrate structure, the first metal line, and the remaining first insulation layer;

patterning the second insulation layer to form a trench aligned over the second metal line and to expose the remaining first insulation layer;

removing the remaining first insulation layer to form a via hole under the trench to expose the second metal line;

forming a second metallic layer over the insulation layer and filling the trench and the via; and planarizing the second metallic layer until the second insulation layer is exposed.

2. The method of claim 1, comprising the further step of forming the first metallic layer by depositing at least one of copper, aluminum and aluminum-copper alloys.

3. The method of claim 1, comprising the further step of forming the first insulation layer by silicon nitride.

4. The method of claim 1, comprising the further step of patterning the first insulation layer and the first metallic layer using reactive ion etching.

5. The method of claim 1, comprising the further step of removing the first insulation layer using reactive ion etching.

6. The method of claim 1, comprising the further step of forming the second insulation layer by silicon oxide.

7. The method of claim 1, wherein the distance between a top surface of the second insulation layer and a top surface of the remaining first insulation layer is approximately the same as the height of the remaining first insulation layer.

8. The method of claim 1, comprising the further step of patterning the second insulation layer using reactive ion etching.

9. The method of claim 1, comprising the further step of removing the remaining first insulation layer using wet etching method.

10. The method of claim 1, comprising the further step of removing the remaining first insulation layer with a higher selectivity of the first insulation than the second insulation layer.

11. The method of claim 1, comprising the further step of forming a glue/barrier layer conformal to the trench and the via hole before forming the second metallic layer.

12. The method of claim 11, comprising the further step of forming the conformal glue/barrier layer by at least one of titanium/titanium nitride and tantalum/tantalum nitride.

13. The method of claim 1, comprising the further step of forming the second metallic layer by at least one of copper, aluminum and aluminum-copper alloy.

14. The method of claim 1, comprising the further step of planarizing the second metallic layer by a chemical-mechanical polishing method.

15. A method for use of a dual damascene process, comprising:

providing a substrate structure;

forming a first metallic line covered by a conformal insulation layer over the substrate structure;

patterning the conformal insulation layer to form at least one stud covering a second metal line of the first metallic line, the exposed first metallic line being as a first metal line;

forming a second insulation layer to cover the substrate structure, the first metal line, and the stud;

forming an opening aligned over the second metal line within the second insulation layer and to expose the stud; and deepening the opening by removing the stud.

16. The method of claim 15, comprising the further step of forming a contact via within the opening after removing the stud.

17. The method of claim 16, the step of forming a contact via within the opening further comprising:

forming a glue/barrier layer on and conformal to the opening; and forming a metal layer on the glue/barrier layer to fill the opening.

18. The method of claim 17, comprising the further step of forming the conformal glue/barrier layer by at least one of titanium/titanium nitride and tantalum/tantalum nitride.

19. The method of claim 16, comprising the further step of forming the second metallic layer by at least one of copper, aluminum and aluminum-copper alloy.

20. The method of claim 1, the step of forming the first metallic line covered by the conformal insulation layer further comprising:

forming a first metallic layer over the substrate structure;

forming a first insulation layer on the first metallic layer; and patterning the first insulation layer and the first metallic layer.

21. The method of claim 20, comprising the further step of forming the first metallic layer by depositing at least one of copper, aluminum and aluminum-copper alloys.

22. The method of claim 20, comprising the further step of forming the first insulation by silicon nitride.

23. The method of claim 20, comprising the further step of forming the first insulation layer and the first metallic layer using reactive ion etching.

24. The method of claim 15, comprising the further step of forming the first metallic line by at least one of copper, aluminum and aluminum-copper alloys.

25. The method of claim 15, comprising the further step of forming the conformal insulation layer by silicon nitride.

26. The method of claim 15, comprising the further step of removing the conformal insulation layer using reactive ion etching.

27. The method of claim 15, comprising the further step of forming the second insulation layer by silicon oxide.

28. The method of claim 15, wherein the distance between a top surface of the second insulation layer and a top surface of the stud is approximately the same as the height of the stud.

29. The method of claim 15, comprising the further step of patterning the second insulation layer using reactive ion etching.

30. The method of claim 15, comprising the further step of removing the stud using wet etching method.

31. The method of claim 1, comprising the further step of removing the remaining stud with a higher selectivity of the stud than the second insulation layer.

32. The method of claim 15, wherein the conformal insulation layer and the second insulation layer are made from different materials.

33. A method for forming at least an interconnect over a substrate structure, comprising:

forming a first metal line on the substrate structure;

forming at least a stud to cover a part of the first metal line;

forming an insulation layer to cover the substrate structure, the first metal line and the stud;

removing a part of the insulation layer to expose the stud;

removing the expose stud to form a contact window to expose the part of the first metal line; and forming a metal layer to fill the contact window.

* * * * *